United States Patent
Marquardt et al.

(10) Patent No.: US 6,882,246 B2
(45) Date of Patent: Apr. 19, 2005

(54) SYSTEM AND METHOD FOR AN ELECTRONICALLY TUNABLE FREQUENCY FILTER HAVING CONSTANT BANDWIDTH AND TEMPERATURE COMPENSATION FOR CENTER FREQUENCY, BANDWIDTH AND INSERTION LOSS

(75) Inventors: Gregory H. Marquardt, W. Melbourne, FL (US); James B. Offner, Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 88 days.

(21) Appl. No.: 10/334,974

(22) Filed: Jan. 2, 2003

(65) Prior Publication Data

US 2004/0130414 A1 Jul. 8, 2004

(51) Int. Cl.[7] .............................. H03H 7/00; H04B 3/04
(52) U.S. Cl. ...................... 333/174; 333/175; 333/17.1
(58) Field of Search ............................. 333/17.1, 155, 333/174, 175, 177, 178, 185, 204, 206, 207, 223, 229

(56) References Cited

U.S. PATENT DOCUMENTS

| | | | | |
|---|---|---|---|---|
| 5,917,387 A | * | 6/1999 | Rice et al. | 333/174 |
| 6,094,588 A | | 7/2000 | Adam | |
| 6,160,460 A | * | 12/2000 | Hicks et al. | 333/17.1 |
| 6,518,859 B1 | * | 2/2003 | Spampinato | 333/174 |

OTHER PUBLICATIONS

International Search Report for International Application No. PCT/US03/40636.

* cited by examiner

*Primary Examiner*—Robert Pascal
*Assistant Examiner*—Dean Takaoka
(74) *Attorney, Agent, or Firm*—Duane Morris LLP

(57) ABSTRACT

A novel system and method for a frequency tunable filter is described. The inventive system and method may be used, for example, in multi-band cellular phones and/or transceivers in wireless networks. The inventive system and method avoids the creation of undesired spurs thus minimizing design difficulties and obviating the need for complex multiple frequency conversions and the associated deleterious effects on performance. The inventive system and method provides at an output terminal an output signal at one of a plurality of predetermined frequencies. The inventive system and method comprises input circuitry for providing an input signal that is at least in part a function of a dynamic parameter, a processor for providing a control signal as a function of said input signal, and at least one adjustable resonance circuit capable of providing a filter signal at one of a plurality of predetermined frequencies in response to said control signal, wherein said filter signal is applied to said output terminal to thereby provide said output signal at one of a plurality of predetermined frequencies. The present inventive system and method also provides for reducing spurious signals from a composite signal created from mixing a plurality of signals by filtering the composite signal.

17 Claims, 3 Drawing Sheets

SYSTEM AND METHOD FOR AN ELECTRONICALLY TUNABLE FREQUENCY FILTER HAVING CONSTANT BANDWIDTH AND TEMPERATURE COMPENSATION FOR CENTER FREQUENCY, BANDWIDTH AND INSERTION LOSS

BACKGROUND OF THE INVENTION

Current frequency plans for frequency converters can be very complex due to the desired avoidance of creating interfering signals or spurs. One of the most important aspects in any radio frequency transceiver design is a properly chosen frequency plan. The basis for frequency planning is drawn from the well-known formula describing the creation of a spurious signal as follows:

$$f_{sp} = mf_{rf} \pm nf_{lo}$$

where $f_{sp}$ is the spurious output frequency or spur, $f_{rf}$ is the frequency of the RF signal and $f_{lo}$ is the local oscillator frequency.

Frequency plans have become quite complicated for modern communication systems such as multi-band cellular phones and transceivers in wireless networks. The design of these communication devices involve finding optimum solutions to several issues. These issues include defining the proper intermediate frequency to eliminate in band spurious signals, minimizing the number of IF filters, and determining the frequency swing for the voltage controlled oscillator. As a result there is a need for a frequency tunable filter for avoiding the creation of these undesired spurs, thus eliminating design difficulties, obviating the need for complex control multiple frequency conversions and the associated deleterious effects on performance and cost ineffectiveness that accompanies them.

Furthermore, with limited spectrum resources serving greater and greater numbers of users the need for precise control of bandwidth and center frequency become even more important in the crowded airwaves. Bandpass, band reject and other types of filters composed of electronic components experience bandwidth variance as well as center frequency creep as a result of, among other things, temperature changes and the associated effect on the electrical characteristics of the electronic components. Typical transceivers deployed with these types of filters either operate with the aforementioned performance degradation or employ complicated and expensive compensation circuitry to combat this problem. Thus there is a need for a frequency tunable filter with temperature compensation to maintain a constant bandwidth and steadfast center frequency without sacrificing performance or cost effectiveness.

Accordingly, it is an object of the present invention to obviate many of the above problems in the prior art to provide a novel system and method for a frequency tunable filter to provide at an output terminal an output signal at one of a plurality of predetermined frequencies comprising, input circuitry for providing an input signal that is at least in part a function of a dynamic parameter, a processor for providing a control signal as a function of said input signal; and at least one adjustable resonance circuit capable of providing a filter signal at one of a plurality of predetermined frequencies in response to said control signal, wherein said filter signal is applied to said output terminal to thereby provide said output signal at one of a plurality of predetermined frequencies.

It is also an object of the present invention to provide a novel improved method for reducing spurious signals from a composite signal created from mixing a plurality of signals by filtering the composite signal. An improvement in one embodiment can include the steps of selecting a control signal from a set of predetermined control signals, tuning the frequency of a filter based on the selected control signals and filtering the composite signal with the tuned filter.

These and many other objects and advantages of the present invention will be readily apparent to one skilled in the art to which the invention pertains from a perusal of the claims, the appended drawings, and the following detailed description of the preferred embodiments.

DETAILED DESCRIPTION OF THE INVENTION

Figure 1:
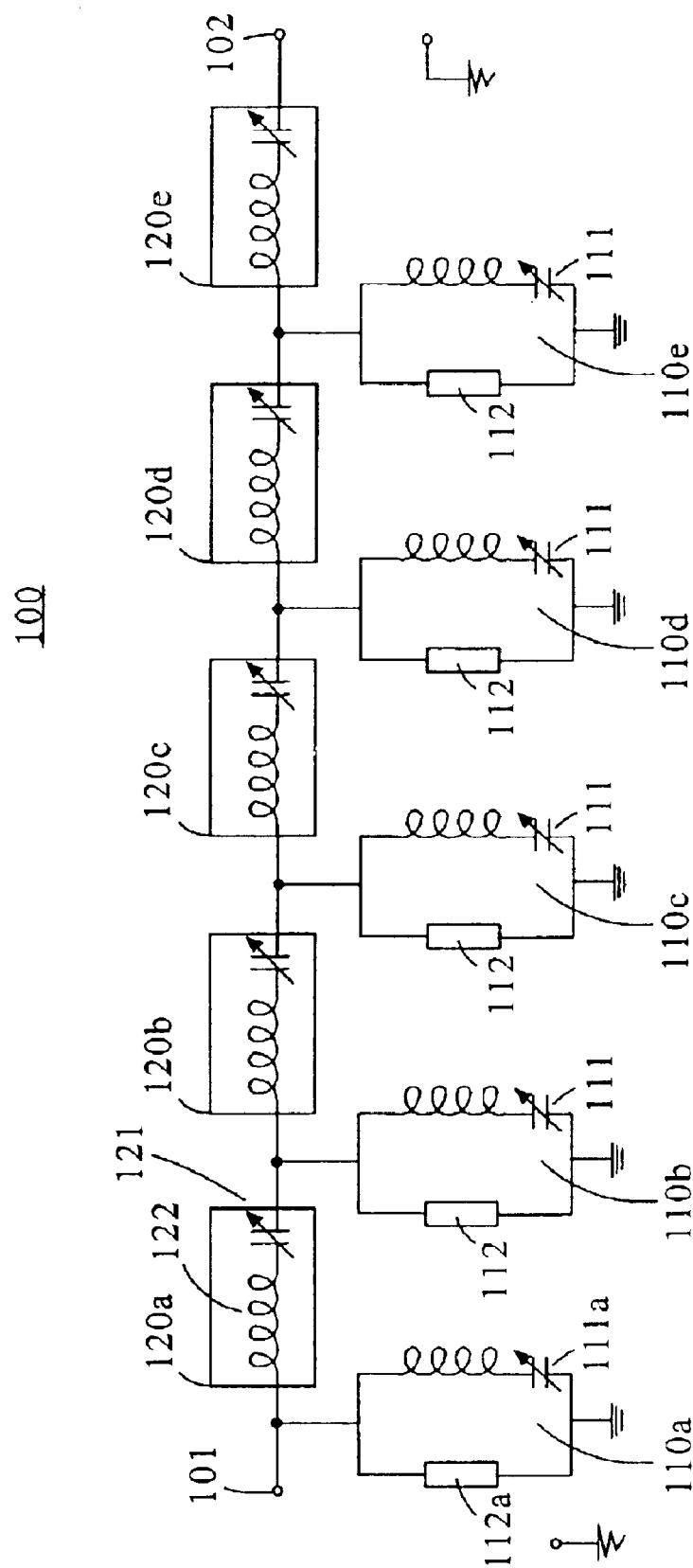
FIG. 1 is a representation of a frequency tunable bandpass filter according to an embodiment of the present invention.

FIG. 1 is a schematic of a frequency tunable bandpass filter 100 according to an embodiment of the present invention, although a band pass filter is shown, the subject matter of the present invention is applicable to other type of filters such as, but not limited to, band reject or slot filters. The tunable filter 100 is composed of one or more adjustable resonance circuits 110a–e in parallel that define the center frequency of the filter and one or more of bandwidth control circuits 120a–e that define the bandwidth of the filter.

The resonance circuits 110a–e shown are composed of inductance elements 112 and variable capacitance elements which allow for center frequency adjustments. The variable capacitance elements preferably are implemented with varactors. As is known in the art, a varactor can change its capacitance as a function of the change of capacitance of a pn junction. A pn junction's capacitance decreases with increasing reverse voltage. The use of varactors in variable capacitance application is well known in the art, and thus not further expanded upon here. Although not shown in FIG. 1, coaxial resonators with varactors or other means to tune the resonance frequency is likewise envisioned. The bandpass filter shown in FIG. 1 may typically include biasing circuitry to remove circuit and DC bias as is known in the art.

Each of the bandwidth control circuits 120a–e is comprised of inductors 122 and variable capacitance components, which may be varactors as described above with reference to the resonance circuits. In that both the bandwidth and the center frequency are governed in part by the variable capacitance components, controlling the capacitance of the variable capacitance component controls (tunes) the filter. The filter 100 is tuned to one of the predetermined frequency centers and bandwidths for the filter signal desired as an output signal at the output terminal 102.

Figure 2:
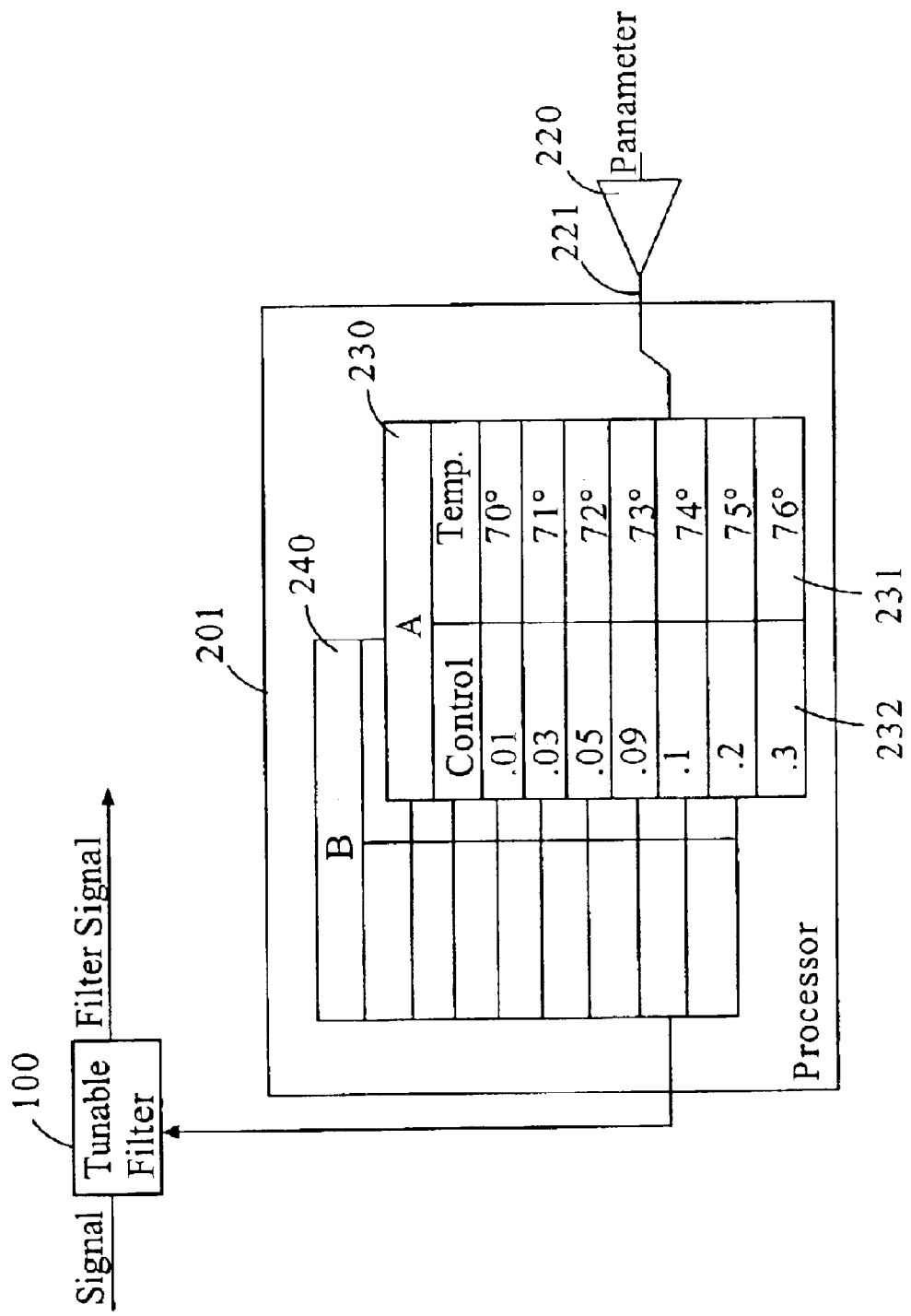
FIG. 2 is a representation of a processor with a look up table according to an embodiment of the present invention.

FIG. 2 is a representation of a processor 200 for controlling the resonance frequency of the resonance circuits 110 and the bandwidth controller circuits 120 via the variable capacitance components. The resonance frequency of the adjustable resonance circuits allows the filter 100 to provide a plurality of predetermined frequencies. The processor 200 can also control the same by varying the inductance of variable inductance elements (adjustable frequency coaxial resonators, variable inductors, etc.). The processor 200 correlates a changeable or dynamic parameter to a desired output or control signal 232. The dynamic parameter can be a center frequency, bandwidth or a characteristic such as temperature that can deleteriously affect the center frequency, bandwidth or other function of the filter 100 and therefore requires compensation to remove the deleterious effect or change filter settings.

The processor 200 can contains one or more look up tables to correlate the input (dynamic parameter) from the input circuitry 221 and control signals 232 to obtain the desired properties for the variable capacitance components and thus the filter 100. The processor 200, for illustration contains two tables, one for temperature compensation 230 and another for center frequency 240. The processor can have numerous tables for correlating various parameters, and additionally each table preferably would have plural layers of tables, one for each varactor or variable component controlled.

In the illustration of FIG. 2, look up table 230 correlates temperature to a control voltage which in turn adjusts the varactors 111 and 121 of the electronically tunable filter 100. For example as shown in FIG. 2, a temperature parameter 231 of 72 degrees correlates to a control signal voltage 232 of 0.05 for one or more of the variable components to adjust for temperature induced capacitance or resonance changes. Similarly table 240 could correspond a new center frequency to a set of capacitance's and related control signals that adjust the variable components such that the filter 100 is tuned to a desired center frequency. The control signals or output of the processor can be empirically determined, theoretically derived or adaptively determined. The input to the processor may be voltages, signals or other indication at least in part that represents the value of the dynamic parameter desired or present.

For dynamic parameters related to physical properties, such as temperature, the values of the dynamic parameter can be represented to the processor 200 via a transducer 220, such as a thermal couple, or thermal pad. The processor 200 may include cascades of lookup tables 230 to correlate input signal 231 related to the dynamic parameter to a series of control signals 232 related to the desired filter properties, one for each of the variable components. The processor 200 may employ mathematical operations on the inputs 231 to obtain the output value inclusive or exclusive of a classical look up table.

Figure 3:
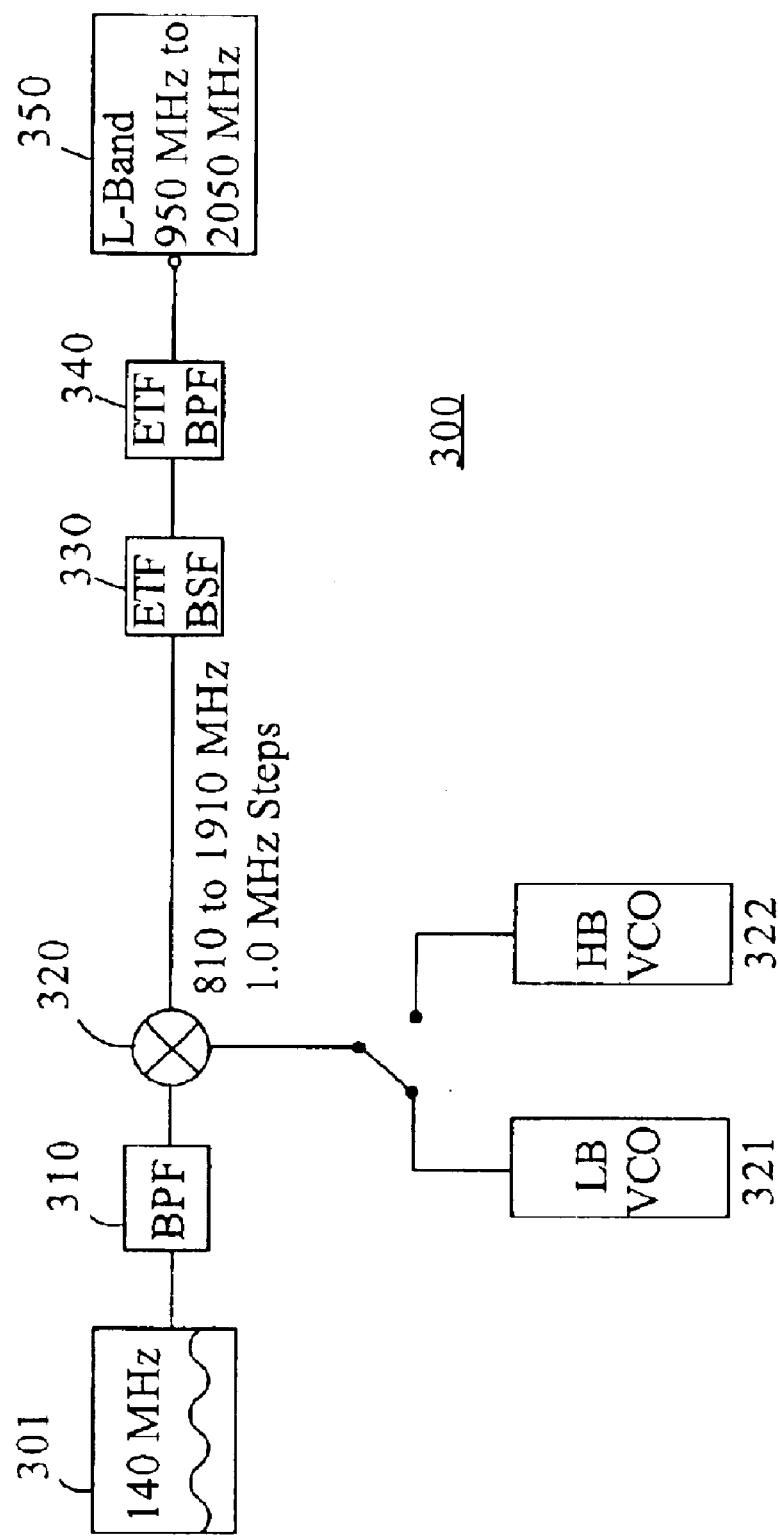
FIG. 3 is a schematic of a frequency converter with a frequency tunable filter according to an embodiment of the present invention.

FIG. 3 shows a schematic of a frequency converter with a frequency tunable filter in the L-band. The L-Band is a portion of the electromagnetic spectrum commonly used in satellite and microwave application, with frequencies in the 400 MHz to 2100 MHz, however this band is used for illustration only and the invention should not be construed to be limited to this band.

An input signal 301 having a frequency of 140 MHz is passed through a standard band pass filter 310, and then is mixed in mixer 320 with a frequency supplied by a lowband VCO 321 or a highband VCO 322, the mixing frequency being, for example between 810–1910 MHz in 1 MHz steps. The mixed or composite signal, complete with spurious and unwanted signals can be filter in an electronically tunable filter 330 according to an embodiment of the present invention, as illustrated a band slot filter, and further filtered by an electronically tunable bandpass filter 340 as taught in an embodiment of the present invention. The result of the mixing and filtering resulting in a output signal 350 in the L-band 950 to 2050 MHz. The frequency converter 300 in FIG. 3 may also include other electronic components such as attenuates, switches, amplifiers etc. as commonly known in the art.

While preferred embodiments of the present invention have been described, it is to be understood that the embodiments described are illustrative only and that the scope of the invention is to be defined solely by the appended claims when accorded a full range of equivalence, many variations and modifications naturally occurring to those of skill in the art from a perusal hereof.

What we claim is:

1. A frequency tunable filter to provide at an output terminal an output signal at one of a plurality of predetermined frequencies comprising:
   input circuitry for providing an input signal that is at least in part a function of a dynamic parameter;
   a processor for providing a control signal as a function of said input signal; and
   at least one adjustable resonance circuit capable of providing a filter signal at one of a plurality of predetermined frequencies in response to said control signal,
   wherein said filter signal is applied to said output terminal to thereby provide said output signal at one of a plurality of predetermined frequencies;
   wherein the at least one adjustable resonance circuits comprise varactors and the at least one adjustable resonance circuits comprise coaxial resonators.

2. The filter according to claim 1, wherein the input circuitry comprises a transducer.

3. The filter according to claim 1, wherein the dynamic parameter is bandwidth.

4. The filter according to claim 1 wherein the dynamic parameter is center frequency.

5. The filter according to claim 2 wherein the dynamic parameter is temperature.

6. The filter according to claim 1 wherein the filter is a bandpass filter.

7. The filter according to claim 1 comprising at least two adjustable resonance circuits, wherein two or more resonance circuits are adjusted by the control signal.

8. The filter according to claim 1 wherein the control signal is a voltage.

9. The filter according to claim 1 wherein the value of the dynamic parameter is a voltage.

10. The filter according to claim 1, wherein the processor comprises a look up table.

11. The filter according to claim 10, wherein the look up table comprises a plurality of control signals for each value of the dynamic parameter, wherein one of the plurality of control signals controls the resonance of the one of the at least one resonance circuits.

12. A frequency tunable filter to provide at an output terminal an output signal at one of a plurality of predetermined frequencies comprising:
   input circuitry for providing an input signal that is at least in part a function of a dynamic parameter;
   a processor for providing a control signal as a function of said input signal; and
   at least one adjustable resonance circuit capable of providing a filter signal at one of a plurality of predetermined frequencies in response to said control signal,
   wherein said filter signal is applied to said output terminal to thereby provide said output signal at one of a plurality of predetermined frequencies wherein the filter is a band reject filter.

13. A frequency tunable filter to provide at an output terminal an output signal at one of a plurality of predetermined frequencies comprising:
   input circuitry for providing an input signal that is at least in part a function of a dynamic parameter;

a processor for providing a control signal as a function of said input signal; and at least one adjustable resonance circuit capable of providing a filter signal at one of a plurality of predetermined frequencies in response to said control signal, wherein said filter signal is applied to said output terminal to thereby provide said output signal at one of a plurality of predetermined frequencies;

wherein the input circuitry comprises a thermal pad.

14. A method of providing an output signal at one of a plurality of predetermined frequencies at an output terminal of a frequency tunable filter comprising:

(a) providing an input signal that is at least in part a function of bandwidth;

(b) determining from a processor a control signal as a function of the input signal;

(c) providing at least one adjustable resonance circuit capable of providing a filter signal at one of a plurality of predetermined frequencies in response to said control signal; and (d) applying the filter signal to the output terminal to thereby provide said output signal at one of a plurality of predetermined frequencies wherein the step of providing an input signal employs a transducer.

15. The method according to claim 14, wherein the processor is a look up table.

16. The method according to claim 14, wherein the input signal is at least in part a function of center frequency.

17. The method according to claim 14, wherein the input signal is at least in part a function of temperature.

* * * * *